United States Patent
Heo et al.

(10) Patent No.: US 7,474,678 B2
(45) Date of Patent: Jan. 6, 2009

(54) OPTICALLY PUMPED SEMICONDUCTOR LASER

(75) Inventors: Duchang Heo, Suwon-si (KR);
Mun-Kue Park, Suwon-si (KR);
Jung-Koa Lee, Daejeon (KR);
Sun-Lyeong Hwang, Suwon-si (KR);
Sung-Soo Park, Suwon-si (KR);
Yong-Chan Keh, Suwon-si (KR)

(73) Assignee: Samsung Electronics Co., Ltd., Maetan-Dong, Yeongtong-Gu, Suwon-Si, Gyeonggi-Do (KR)

( * ) Notice: Subject to any disclaimer, the term of this patent is extended or adjusted under 35 U.S.C. 154(b) by 31 days.

(21) Appl. No.: 11/396,780

(22) Filed: Apr. 3, 2006

(65) Prior Publication Data
US 2007/0009003 A1    Jan. 11, 2007

(30) Foreign Application Priority Data
Jul. 5, 2005    (KR)    .................. 10-2005-0060483

(51) Int. Cl.
*H01S 3/10* (2006.01)

(52) U.S. Cl. .......................................... 372/22; 372/70

(58) Field of Classification Search .................. 372/70, 372/18, 22, 79, 95, 92
See application file for complete search history.

(56) References Cited

U.S. PATENT DOCUMENTS

| | | | | |
|---|---|---|---|---|
| 3,975,693 A * | 8/1976 | Barry et al. | ................. | 372/22 |
| 4,127,827 A * | 11/1978 | Barry | ........................ | 372/22 |
| 4,413,342 A * | 11/1983 | Cohen et al. | ............... | 372/22 |
| 4,853,933 A * | 8/1989 | Blow et al. | ................. | 372/18 |
| 5,048,030 A * | 9/1991 | Hiiro | ........................ | 372/68 |
| 5,651,019 A * | 7/1997 | Goldberg et al. | .......... | 372/68 |
| 6,370,168 B1 * | 4/2002 | Spinelli | ...................... | 372/22 |
| 6,393,038 B1 * | 5/2002 | Raymond et al. | .......... | 372/22 |
| 6,680,956 B2 * | 1/2004 | Gerstenberger et al. | ... | 372/20 |
| 6,859,481 B2 * | 2/2005 | Zheng | ...................... | 372/70 |

* cited by examiner

*Primary Examiner*—Minsun Harvey
*Assistant Examiner*—Tuan N. Nguyen
(74) *Attorney, Agent, or Firm*—Cha & Reiter, LLC

(57) ABSTRACT

An optically pumped semiconductor laser and an optical pumping method are disclosed. The optically pumped semiconductor laser includes an output mirror and a reflective mirror for forming a resonant region therebetween, a gain medium disposed between the output mirror and the reflective mirror and a light source for applying a source light in a direction between the output mirror and the gain medium to activate the gain medium, whereby the optical axes of the light from the source light and the light generated from the gain medium are substantially perpendicular to each other and the optical axes of a second harmonic generated from a nonlinear crystal is substantially equal to the optical axis of the light generated from the gain medium.

17 Claims, 2 Drawing Sheets

OPTICALLY PUMPED SEMICONDUCTOR LASER

CLAIM OF PRIORITY

This application claims the benefit pursuant to 35 U.S.C. § 119 of the earlier filing date of that patent application filed Jul. 5, 2005 in the Korean Patent Office and afforded Application Serial No. 2005-60483, the disclosure of which is incorporated by reference in its entirety, herein.

BACKGROUND OF THE INVENTION

1. Field of the Invention

The present invention relates to a semiconductor laser and, more particularly, to an optically pumped semiconductor laser.

2. Description of Related Art

In general, three colors R (red), G (green) and B (blue) in the visible light region (380 nm to 760 nm) can be obtained using a semiconductor laser or non-linear second light source of wavelengths 635 nm, 532 nm, and 455 nm, respectively. Red and blue light can be obtained directly by a semiconductor laser, while green light can be obtained by a non-linear second light source. However, it is advantageous to obtain the blue light using the non-linear second light source.

Red light (635 nm) can be directly obtained by a laser of tens of milliwatts (mW) fabricated by growing an AlGaInP active layer on a GaAs substrate. On the other hand, green light (532 nm) or blue light (455 nm) can be obtained through second harmonic generation (SHG) by passing an infrared laser of 1064 nm or 920 nm through a nonlinear crystal.

Recently, a vertical extended cavity surface-emitting laser (VECSEL) having high efficiency is attracting attention as a new technology. The VECSEL includes a semiconductor epitaxy structure having a distributed Bragg reflector mirror (DBR), an active layer, such as a quantum well, a cladding window and a resonator with an output mirror. A nonlinear crystal is inserted into the resonator to obtain intracavity-type second harmonic generation (SHG).

The VECSEL is classified as an optically pumped semiconductor laser for exciting semiconductor epitaxy through optical pumping, which is available from Coherent Inc. A second type of VECSEL is referred to as a Novalux VECSEL (NECSEL) employing an electric injection type, which is available from Novalux Inc.

A conventional optically pumped semiconductor laser is disclosed in U.S. Pat. No. 5,991,318, entitled "Intracavity Frequency-Converted Optically Pumped Semiconductor Laser". The '318 patent describes a method of introducing pumped light at an angle inclined to a surface. However, when a pumped light source of '318 patent and the epitaxy structure are adjacent to each other, it is difficult to miniaturize the laser as a focusing lens blocks infrared light.

Further, it is difficult to conform an optical axis of light generated by a resonator to an optical axis of the pumped light, i.e., the source light applied from the light source. When the optical axes are not aligned to each other optical pumping efficiency is decreased dependent upon the degree of difference as a pumped light incident region is different from the position of light generated by the resonator.

Further, although the optical axes may be aligned to each other, when the shape of the light generated by the resonator is different from that of the pumped incident light, optical pumping efficiency may be also decreased.

SUMMARY OF THE INVENTION

One aspect of the present invention is related to an optical pumping method and an optically pumped semiconductor laser capable of miniaturizing the structure of an optically pumped semiconductor laser.

Another aspect of the present invention is to provide an optical pumping method and optically pumped semiconductor laser capable of approximately aligning optical axes of pumped light and light generated from a resonator to each other.

An optically pumped semiconductor laser in accordance with one aspect of the present invention includes an output mirror and a reflective mirror for forming a resonant region, a gain medium disposed between the output mirror and the reflective mirror and a light source for applying a source light in a lateral direction between the output mirror and the gain medium to activate the gain medium.

The reflective mirror may be provided with a distributed Bragg reflector mirror for reflecting the source light and a basic wavelength generated from the gain medium.

A reflective body may be disposed between the output mirror and the gain medium to reflect the source light to the gain medium and to transmit a basic wavelength generated from the gain medium, and the reflective body may be disposed to be inclined toward the reflective mirror.

A nonlinear crystal disposed between the reflective body and the output mirror to generate a predetermined wavelength as a second harmonic of the basic wavelength generated from the gain medium.

An optical axis of the source light reflected by the reflective mirror to the gain medium, wherein an optical axis of the basic wavelength generated from the gain medium, and an optical axis of the predetermined wavelength are approximately equal to one another.

A filter in one aspect may be disposed at a surface of the nonlinear crystal opposite to the reflective body to reflect the predetermined wavelength and to transmit the basic wavelength.

A selective reflective part in one aspect may be installed at a surface of the output mirror opposite to the nonlinear crystal to transmit the predetermined wavelength and to reflect the basic wavelength.

The gain medium in one aspect may include a plurality of quantum wells, and the reflective mirror in one aspect may include a heat sink.

In one aspect of the invention, the optically pumped semiconductor laser having an optical axis of the source light reflected by the reflective mirror directed to the gain medium and an optical axis of the basic wavelength generated from the gain medium are approximately equal to each other.

An optically pumped semiconductor laser in accordance with another aspect of the present invention includes a light source for generating a source light, a reflective body for reflecting the source light, a gain medium for generating a basic wavelength by applying the light reflected by the reflective body, a reflective mirror for reflecting the source light passed through the gain medium back to the gain medium, a nonlinear crystal for generating a predetermined wavelength, which is a second harmonic of the basic wavelength and an output mirror for outputting the generated second harmonic light passed through the nonlinear crystal to the exterior.

The reflective mirror may be provided with a distributed Bragg reflector mirror reflecting the basic wavelength and the source light.

The gain medium in one aspect may include a plurality of quantum wells.

The reflective body in one aspect may transmit the basic wavelength and reflect the source light.

An optical axis of the source light reflected by the reflective mirror to the gain medium, an optical axis of the basic wavelength generated from the gain medium, and an optical axis of a predetermined wavelength may be approximately equal to one another.

A filter may be disposed at a surface of the nonlinear crystal opposite to the reflective body to reflect the predetermined wavelength and to transmit the basic wavelength.

A selective reflective part in one aspect may be installed on a surface of the output mirror opposite to the nonlinear crystal to transmit the predetermined wavelength and to reflect the basic wavelength.

The reflective mirror in one aspect may include a heat sink formed at its lower part.

An optical axis of the source light and an optical axis of the basic wavelength generated from the gain medium are approximately perpendicular to each other.

An optical pumping method in accordance with yet another aspect of the present invention includes applying a source light in a lateral direction between a gain medium and a nonlinear crystal, reflecting the source light towards the gain medium using a reflective body to direct a basic wavelength generated from the gain medium to the nonlinear crystal wherein a predetermined wavelength that is a second harmonic of the basic wavelength is generated; and transmitting the generated predetermined wavelength to the exterior through an output mirror and reflecting the basic wavelength back toward the gain medium.

The reflective body in one aspect may transmit the basic wavelength.

An optical axis of the source light reflected by the reflective mirror to the gain medium, an optical axis of the basic wavelength generated from the gain medium, and an optical axis of the second harmonic are approximately equal to one another.

A filter in one aspect may be disposed at a surface of the nonlinear crystal opposite to the reflective body to reflect the predetermined wavelength and to transmit the basic wavelength.

A selective reflective part may be formed at a surface of the output mirror opposite to the nonlinear crystal to transmit the predetermined wavelength and to reflect the basic wavelength.

An optical axis of the source light and an optical axis of the basic wavelength generated from the gain medium may be approximately perpendicular to each other.

DETAILED DESCRIPTION OF THE INVENTION

Hereinafter, the detailed description of an exemplary embodiment in accordance with the present invention will be apparent in connection with the accompanying drawings.

Figure 1:
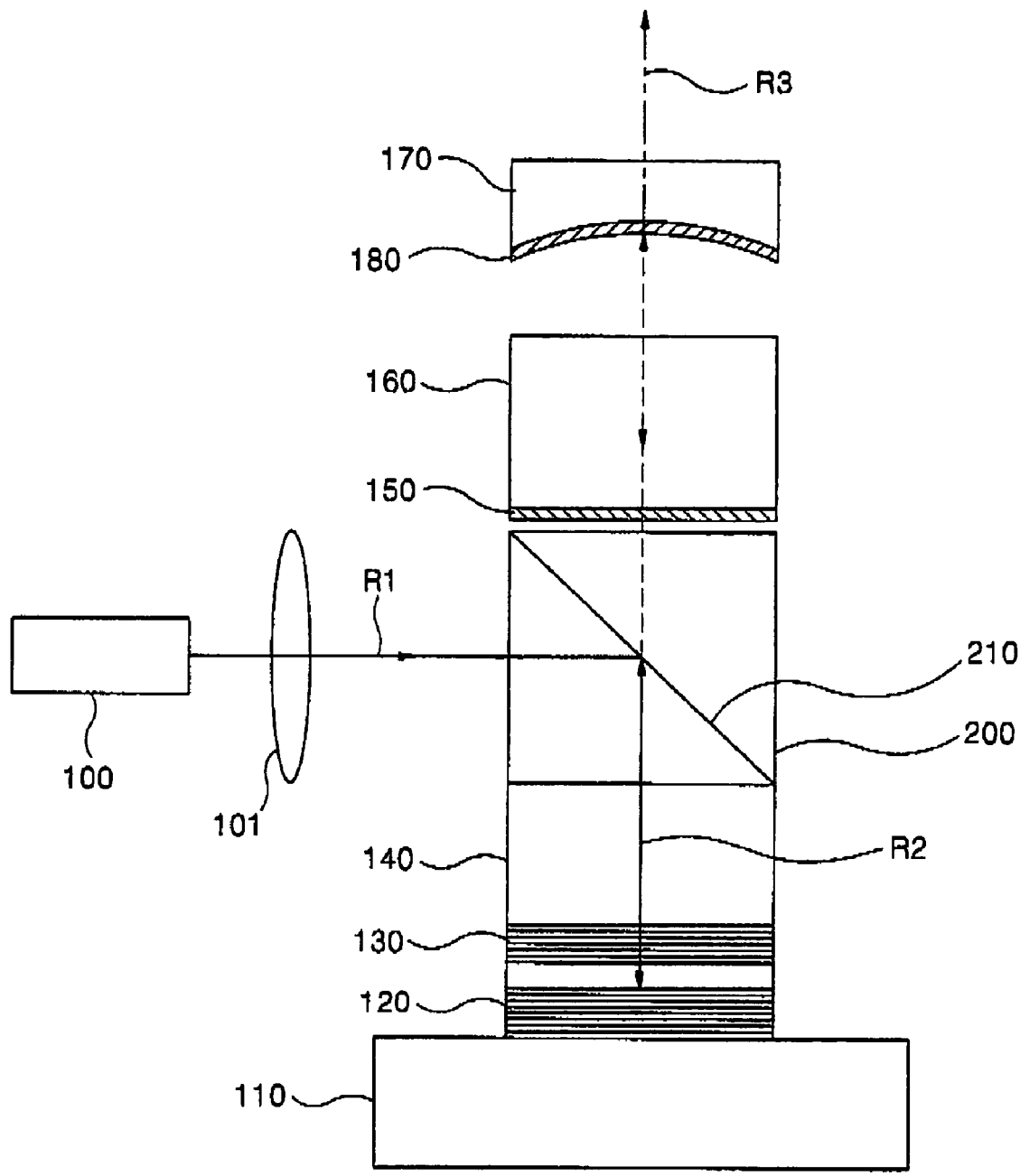
FIG. 1 is a schematic view of an optically pumped semiconductor laser in accordance with an exemplary embodiment of the present invention.

As shown in FIG. 1, an optically pumped semiconductor laser includes a heat sink 110. The heat sink 110 may be formed of silicon carbide or titanium carbide. The heat sink 110 dissipates heat generated during the operation of the optically pumped semiconductor laser to the exterior.

A reflective mirror 120 is installed or deposited on the heat sink 110. The reflective mirror 120 may include a distributed Bragg reflector mirror (DBR) fabricated by a multi-layer epitaxial-growth process among other well-known semiconductor manufacturing processes.

The DBR may be formed by stacking a semiconductor material on a substrate 140 to reflect a desired wavelength. The DBR of the present invention is preferably capable of reflecting wavelengths of 980 nm and 1064 nm (high reflective coating). The DBR may be formed by depositing 30 to 40 alternate pairs of AlAs/GaAs or $Al_{0.98}Ga_{0.02}As/Al_{0.2}Ga_{0.8}As$.

A gain medium 130 is disposed on the reflective mirror 120. The gain medium 130, in one aspect may be a multi-layered quantum well formed by a multi-layer thin film forming process in addition to other well-known semiconductor manufacturing processes.

The gain medium 130 may include pump-absorbing regions, quantum wells for generating a basic wavelength, referred to herein as R2, and a barrier layer for compensating strain.

The quantum well may employ a periodic resonant gain type arranged in antinodes of a standing wave formed in the semiconductor to obtain high gain.

In addition, the quantum well may include a cladding window at its upper side. The cladding window may be formed of Gallium Arsenide Phosphide (GaAsP) or Aluminum Gallium Arsenide ($Al_{0.3}Ga_{0.7}As$) having a large band gap to prevent optically excited carriers from recombining at its surface.

A substrate 140 is disposed on the gain medium 130. The substrate 140 may be formed of Silicone Carbide (SiC).

A periscope 200 is disposed on the substrate 140. The periscope 200 may be formed of transparent Silicon Carbide, and includes a selective reflective body 210 installed in an inclined direction of about 45 degrees with respect to the applied source light generated by a light source 100. Note that the selective reflective body 210 may be inclined at other angles depending on more specific embodiments of the invention disclosed herein.

The selective reflective body 210 may be fabricated by repeatedly depositing Aluminum Arsenide (AlAs) and Aluminum Gallium Arsenide (AlGaAs), and by adjusting the thickness of each layer deposited for high reflective coating and low reflective coating to a specific wavelength.

In the exemplary embodiment in accordance with the present invention, the selective reflective body 210 may be formed by a high reflective coating at 980 nm or a low reflective coating at 1064 nm. In another exemplary embodiment, the periscope 200 may be formed by installing the selective reflective body 210 in a box-shaped space.

A light source 100 is positioned at a side of the periscope 200. Preferably, a light applying direction of the light source 100 is approximately perpendicular to a side surface of the periscope 200. The light source 100 may employ a laser diode. In a preferred embodiment, the wavelength of light source 100, referred to herein as R1 is 980 nm. A focusing lens 101 may be installed between the periscope 200 and light source 100.

A nonlinear crystal 160 is installed over the periscope 200 for generating a predetermined wavelength R3 that is a second harmonic of a basic wavelength, referred to herein as R2, generated in gain medium 130. The nonlinear crystal 160 is a material for generating a frequency higher than the basic wavelength R2 using non-linearity of the basic wavelength of R2 when R2 is applied to the nonlinear crystal 160.

That is, when the basic wavelength R2 of 1064 nm is applied to the nonlinear crystal, a wavelength of 532 nm is generated. The wavelength of 532 nm represents a green light. In this manner, when the basic wavelength R2 is applied to nonlinear crystal 160, a desired color of light can be obtained.

The nonlinear crystal 160 may employ one of KTP (KTiOPO$_4$: potassium titanyl phosphate), LBO (LiB$_3$O$_5$: lithium tri-borate), PPLN (polarized poling lithium niobate), and PPMgOLN (periodically poled magnesium oxide-doped lithium niobate).

A filter 150 is further disposed under the nonlinear crystal 160. The filter 150 may, for example, be a birefringence filter used for selecting a wavelength. That is, the filter 150 transmits the basic wavelength R2 only, while not transmitting the predetermined wavelength R3. Therefore, the predetermined wavelength R3 generated from the nonlinear crystal 160 does not propagate to the periscope 200 disposed under the birefringence filter 150.

An output mirror 170 is installed over the nonlinear crystal 160. The output mirror 170 preferably includes a concave lens. The output mirror 170 functions to focus the predetermined wavelength R3 generated from the nonlinear crystal 160 to the exterior of the laser.

In addition, a selective reflective part 180 is coated on a lower surface of the output mirror 170 to transmit the predetermined wavelength R3 and to reflect the basic wavelength R2. The selective reflective part 180 may be configured with a DBR and the birefringence filter, as discussed previously.

Hereinafter, an optically pumping method of the optically pumped semiconductor laser in accordance with the present invention will be described.

Figure 2:
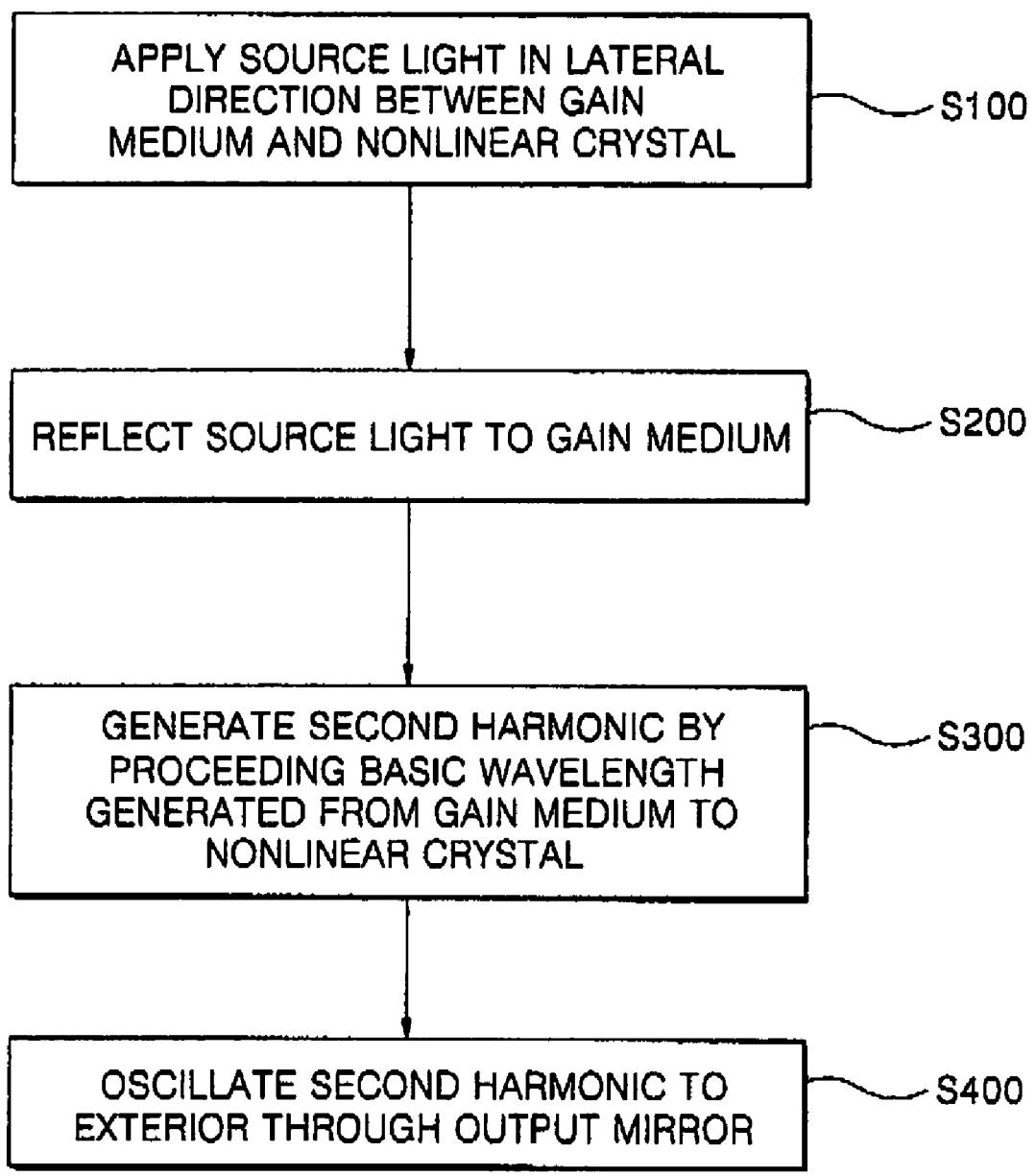
FIG. 2 is a flow chart illustrating an optical pumping method in accordance with an exemplary embodiment of the present invention.

As shown in FIG. 2, a source light R1 of 980 nm is applied from a light source 100 in a lateral direction to periscope 200 (S100). When the source light R1 is applied to the periscope 200, a reflective body 210 of the periscope 200 reflects the source light R1 at a angle downward (S200).

The source light R1 traverses substrate 140, and then is applied to gain medium 130. In this manner, electrons excited in the gain medium 130, formed of a semiconductor material, are transitioned in a plurality of quantum wells to generate a basic wavelength R2 of 1064 nm, for example.

Next, the basic wavelength R2 is reflected by a reflective mirror 120, and then reapplied to the gain medium 130 to repeatedly perform optical pumping. That is, the source light R1 is repeatedly applied between the reflective body 210 of the periscope 200 and the reflective mirror 120 to perform the optical pumping.

The basic wavelength R2 generated from the gain medium 130 is transmitted to upper and lower parts of the gain medium 130. The basic wavelength R2 oscillated to the lower part of the gain medium 130 is reflected by the reflective mirror 120. Therefore, the basic wavelength R2 is directed to the upper part of the gain medium 130.

The reflective body 210 of the periscope 200 transmits the basic wavelength generated from the gain medium 130. Then, the basic wavelength R2 transmitted through the reflective body 210 passes through a birefringence filter 150. The basic wavelength R2 passed through the birefringence filter 150 is applied to a nonlinear crystal 160 to generate a predetermined wavelength R3, which is second harmonic of the incident basic wavelength R2 (S300).

For example, if the basic wavelength is 1064 nm, a green light of 532 nm is generated as the second harmonic of the basic wavelength. Then, the predetermined wavelength R3 generated at this time is reflected by the birefringence filter 150. Therefore, the predetermined wavelength R3 generated from the nonlinear crystal 160 is directed to an output mirror 170. The output mirror 170 focuses the predetermined wavelength R3 as the output of the laser to the exterior (S400).

On the other hand, the basic wavelength R2 passing through the nonlinear crystal 160 is reflected by a selective reflective part 180 formed at a lower surface of the output mirror 170. Therefore, the basic wavelength R2 is resonated between the reflective mirror 120 and the output mirror 170. That is, a space between the output mirror 170 and the reflective mirror 120 is a resonant region of the basic wavelength R2.

Meanwhile, while the appropriate light or wavelength is reflected and transmitted at each region by resonance of the wavelength, heat is generated. The heat is dissipated to the exterior through heat sink 110 installed under the reflective mirror 120. Substrate 140 also performs a dissipation function.

In accordance with the principles of the invention, an optical axis of the source light R1 reflected by the periscope 200, an optical axis of the basic wavelength R2 generated from the gain medium 130, and an optical axis of the second harmonic generated from the nonlinear crystal 160 can be approximately equal to one another.

Therefore, it is possible to minimize optical loss due to dissonance of the optical axes, and to increase optical conversion efficiency. In addition, when the output light has a circular shape, since an inner resonant region is conformed to an optical pumping region, the optical conversion efficiency can be further increased.

Although the present invention has been described with regard to a green light (532 nm), an embodiment can be also applied to the described semiconductor laser by partially modifying the structure of the reflective body, and the reflective mirror to be applicable to a blue light of 455 nm.

As can be seen from the foregoing, the optically pumped semiconductor laser in accordance with the present invention is capable of minimizing optical loss due to dissonance of the optical axes, and increasing optical conversion efficiency by aligning the optical axes of the source light, the basic wavelength generated from the gain medium, and the second harmonic generated from the nonlinear crystal to one another. In addition, the optical conversion efficiency can be increased by conforming the inner resonant region to the optical pumping region.

Further, since the source light can be applied in a lateral direction, it is possible to facilitate packaging of the optically pumped semiconductor laser, easily miniaturize the laser, and increase optical efficiency.

While this invention has been described in connection with what is presently considered to be the most practical and exemplary embodiment, it is to be understood that the invention is not limited to the disclosed embodiment, but on the contrary, it is intended to cover various modification within the spirit and the scope of the Invention, which is set forth in the appended claims.

What is claimed is:

1. An optically pumped semiconductor laser comprising:
    an output mirror and a reflective mirror for forming a resonant region;
    a gain medium disposed between the output mirror and the reflective mirror;
    a reflective body disposed between the output mirror and the gain medium to reflect a source light received in a direction substantially perpendicular between the output mirror and the gain medium to activate the gain medium to generate a basic wavelength;
    a nonlinear crystal disposed between the reflective body and the output mirror to generate a predetermined wavelength that is second harmonic of the basic wavelength generated from the gain medium;

a filter disposed on a surface of the nonlinear crystal opposite to the reflective body to reflect the predetermined wavelength and to transmit the basic wavelength; and a selective reflective part installed on a surface of the output mirror opposite to the nonlinear crystal to transmit the predetermined wavelength and to reflect the basic wavelength.

2. The optically pumped semiconductor laser according to claim 1, wherein the reflective mirror is provided with a distributed Bragg reflector mirror for reflecting the source light and the basic wavelength.

3. The optically pumped semiconductor laser according to claim 1, wherein the reflective body is disposed to be inclined toward the reflective mirror to reflect the source light to the gain medium at an approximately right angle.

4. The optically pumped semiconductor laser according to claim 1, further comprising:
an optical axis of the source light reflected by the reflective mirror to the gain medium, wherein an optical axis of the basic wavelength, and an optical axis of the predetermined wavelength are approximately equal to one another.

5. The optically pumped semiconductor laser according to claim 1, wherein the gain medium comprises a plurality of quantum wells.

6. The optically pumped semiconductor laser according to claim 1, wherein the reflective mirror further comprises:
a heat sink.

7. The optically pumped semiconductor laser according to claim 1, wherein an optical axis of the source light reflected by the reflective mirror to the gain medium and an optical axis of the basic wavelength generated from the gain medium are approximately equal to each other.

8. An optically pumped semiconductor laser comprising:
a reflective body for reflecting a source light provided substantially perpendicular to said reflecting body;
a gain medium for generating a basic wavelength by applying the light reflected by the reflective body, wherein an optical axis of the source light and an optical axis of the basic wavelength generated from the gain medium are approximately perpendicular to each other;
a reflective mirror for reflecting the source light passed through the gain medium back to the gain medium;
a nonlinear crystal for generating a predetermined wavelength, which is a second harmonic of the basic wavelength;
an output mirror for outputting the second harmonic light passed through the nonlinear crystal to the exterior;
a filter disposed at a surface of the nonlinear crystal opposite to the reflective body to reflect the predetermined wavelength and to transmit the basic wavelength; and
a selective reflective part installed on a surface of the output mirror opposite to the nonlinear crystal to transmit the predetermined wavelength and to reflect the basic wavelength.

9. The optically pumped semiconductor laser according to claim 8, wherein the reflective mirror is provided with a distributed Bragg reflector mirror reflecting the basic wavelength and the source light.

10. The optically pumped semiconductor laser according to claim 8, wherein the gain medium comprises a plurality of quantum wells.

11. The optically pumped semiconductor laser according to claim 8, wherein the reflective body transmits the basic wavelength and reflects the source light.

12. The optically pumped semiconductor laser according to claim 8, wherein an optical axis of the source light reflected by the reflective mirror to the gain medium, an optical axis of the basic wavelength generated from the gain medium, and an optical axis of the predetermined wavelength are approximately equal to one another.

13. The optically pumped semiconductor laser according to claim 8, wherein the reflective mirror further comprises:
a heat sink.

14. An optical pumping method comprising:
applying a source light in a direction substantially perpendicular to an optical axis formed between a gain medium and a nonlinear crystal;
reflecting the source light towards the gain medium using a reflective body to direct a basic wavelength generated from the gain medium from the source light to the nonlinear crystal, wherein a predetermined wavelength that is a second harmonic of the basic wavelength is generated;
transmitting the generated predetermined wavelength to the exterior through an output mirror and reflecting the basic wavelength back toward the gain medium;
filtering the reflective body to reflect the predetermined wavelength and to transmit the basic wavelength; and
forming a selective reflective part at a surface of the output mirror opposite to the nonlinear crystal to transmit the predetermined wavelength and to reflect the basic wavelength.

15. The method according to claim 14, wherein the reflective body transmits the basic wavelength.

16. The method according to claim 15, wherein an optical axis of the source light reflected by the reflective mirror to the gain medium, an optical axis of the basic wavelength generated from the gain medium, and an optical axis of the second harmonic are approximately equal to one another.

17. The method according to claim 14, wherein an optical axis of the source light and an optical axis of the basic wavelength generated from the gain medium are approximately perpendicular to each other.

* * * * *

UNITED STATES PATENT AND TRADEMARK OFFICE
CERTIFICATE OF CORRECTION

PATENT NO. : 7,474,678 B2 Page 1 of 1
APPLICATION NO. : 11/396780
DATED : January 6, 2009
INVENTOR(S) : Duchang Heo et al.

It is certified that error appears in the above-identified patent and that said Letters Patent is hereby corrected as shown below:

Title Page
Item [75], third Inventor's name, should read as follows:

--Jung-Kee Lee--.

Signed and Sealed this

Seventh Day of April, 2009

JOHN DOLL
*Acting Director of the United States Patent and Trademark Office*